United States Patent
Kim et al.

(10) Patent No.: US 12,287,373 B2
(45) Date of Patent: Apr. 29, 2025

(54) METHOD FOR DETERMINING REMAINING CAPACITY OF LITHIUM-SULFUR BATTERY, AND BATTERY PACK IMPLEMENTING SAME METHOD

(71) Applicant: LG ENERGY SOLUTION, LTD., Seoul (KR)

(72) Inventors: Bong Soo Kim, Daejeon (KR); Dongseok Shin, Daejeon (KR); Taek Gyoung Kim, Daejeon (KR)

(73) Assignee: LG ENERGY SOLUTION LTD., Seoul (KR)

( * ) Notice: Subject to any disclaimer, the term of this patent is extended or adjusted under 35 U.S.C. 154(b) by 407 days.

(21) Appl. No.: 17/926,919

(22) PCT Filed: Oct. 20, 2021

(86) PCT No.: PCT/KR2021/014719
§ 371 (c)(1),
(2) Date: Nov. 21, 2022

(87) PCT Pub. No.: WO2022/086175
PCT Pub. Date: Apr. 28, 2022

(65) Prior Publication Data
US 2023/0251321 A1 Aug. 10, 2023

(30) Foreign Application Priority Data
Oct. 21, 2020 (KR) .................. 10-2020-0136625

(51) Int. Cl.
*G01R 31/38* (2006.01)
*G01R 31/36* (2020.01)
(Continued)

(52) U.S. Cl.
CPC ..... *G01R 31/3842* (2019.01); *G01R 31/3648* (2013.01); *G01R 31/388* (2019.01); *G01R 31/396* (2019.01)

(58) Field of Classification Search
CPC ............ G01R 31/3842; G01R 31/3648; G01R 31/388; G01R 31/396; G01R 31/378;
(Continued)

(56) References Cited

U.S. PATENT DOCUMENTS

| 9,864,012 B2 | 1/2018 | Moganty et al. |
| 2004/0263126 A1 | 12/2004 | Hanson |

(Continued)

FOREIGN PATENT DOCUMENTS

| JP | 2014-002122 A | 1/2014 |
| JP | 2016-171716 A | 9/2016 |

(Continued)

OTHER PUBLICATIONS

Abbas Fotouhi et al., "Lithium-Sulfur Cell Equivalent Circuit Network Model Parameterization and Sensitivity Analysis", IEEE Transactions on Vehicular Technology, IEEE, USA, vol. 66, No. 9, Sep. 1, 2017, pp. 7711-7721, XP011660873.

(Continued)

*Primary Examiner* — Catherine T. Rastovski
*Assistant Examiner* — Lal C Mang
(74) *Attorney, Agent, or Firm* — Bryan Cave Leighton Paisner LLP

(57) ABSTRACT

The present disclosure provides a method for determining the remaining capacity of a lithium-sulfur battery using a voltage drop value obtained by applying a constant current in an open-circuit state and a battery pack implementing the method.

12 Claims, 7 Drawing Sheets

(51) Int. Cl.
  *G01R 31/3842* (2019.01)
  *G01R 31/388* (2019.01)
  *G01R 31/396* (2019.01)

(58) Field of Classification Search
  CPC ........... G01R 31/382; G01R 19/16528; H01M 10/052; H01M 10/42; H01M 10/48; Y02E 60/10
  See application file for complete search history.

(56) References Cited

U.S. PATENT DOCUMENTS

| | | | |
|---|---|---|---|
| 2005/0237024 A1 | 10/2005 | Hogari et al. | |
| 2009/0055110 A1* | 2/2009 | Kelley | G01R 31/389 320/149 |
| 2015/0234014 A1* | 8/2015 | Moganty | H01M 10/48 320/136 |
| 2016/0266211 A1 | 9/2016 | Imaizumi | |
| 2018/0095141 A1* | 4/2018 | Wild | H01M 10/052 |
| 2018/0248386 A1* | 8/2018 | Hale | H02J 7/0014 |
| 2019/0079136 A1* | 3/2019 | Lim | G01R 31/3842 |

FOREIGN PATENT DOCUMENTS

| | | |
|---|---|---|
| KR | 10-1166099 B1 | 7/2012 |
| KR | 10-2014-0073888 A | 6/2014 |
| KR | 10-2017-0138488 A | 12/2017 |
| KR | 10-2018-0041149 A | 4/2018 |
| KR | 10-2080632 B1 | 4/2020 |

OTHER PUBLICATIONS

Lokesh Gurjer et al., "Detailed Modelling Procedure for Lithium-ion Battery Using Thevenin Equivalent", 2019 IEEE International Conference on Electrical, Computer And Communication Technologies (ICECCT), IEEE, Feb. 20, 2019, pp. 1-6, XP033630262.

* cited by examiner

【Figure 1】
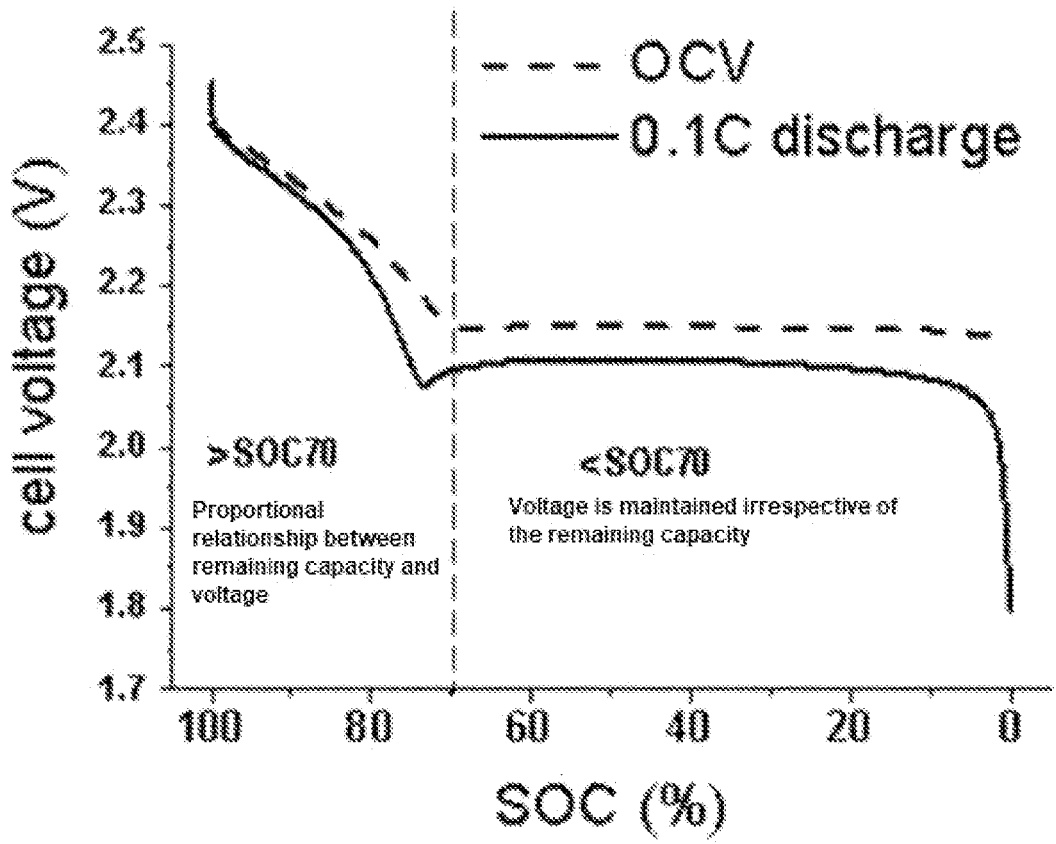
【Figure 2】
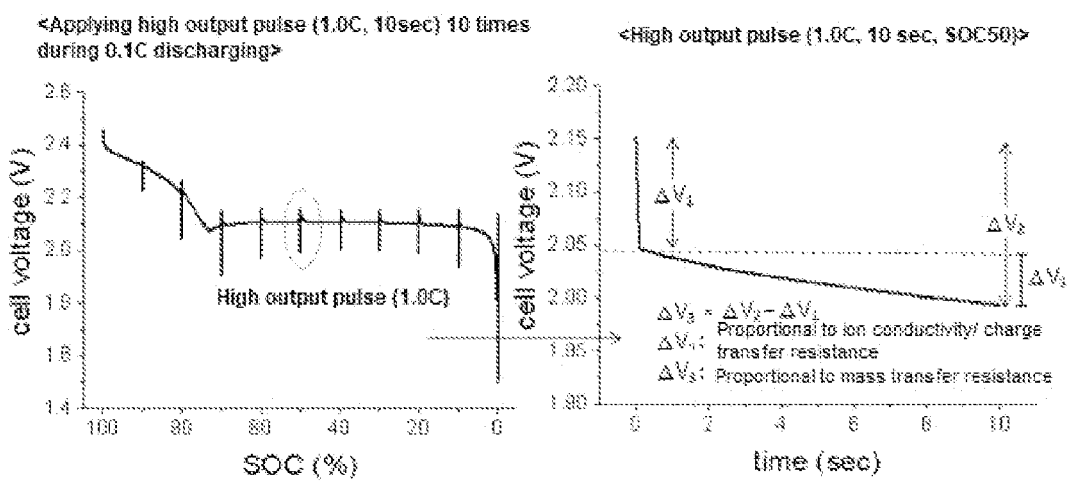

[Figure 3]
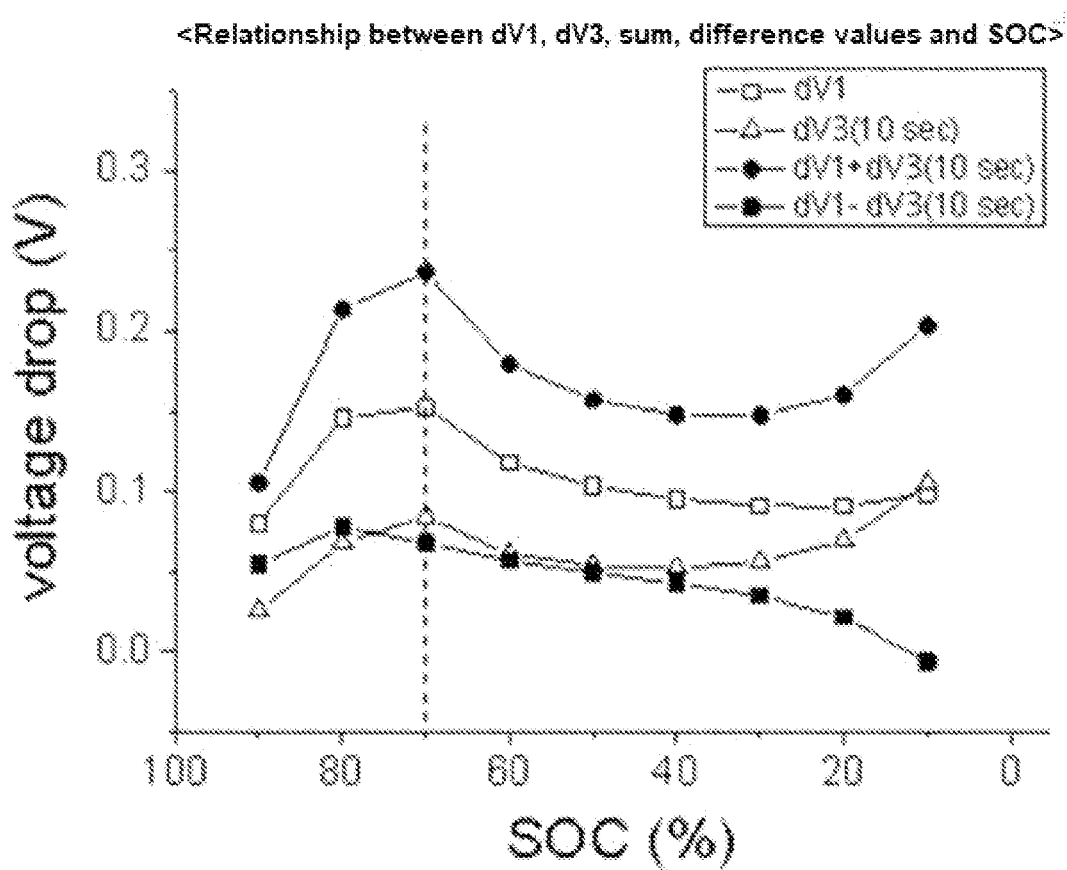

[Figure 4]
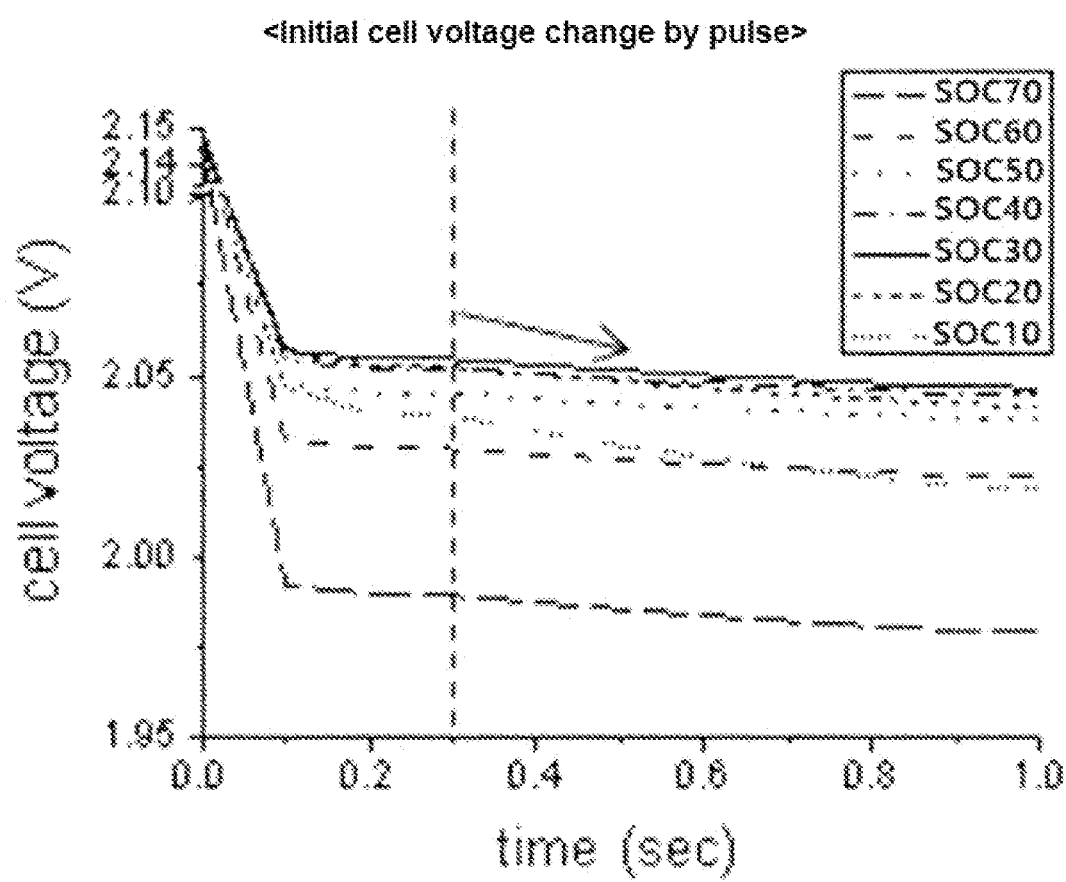

【Figure 5】
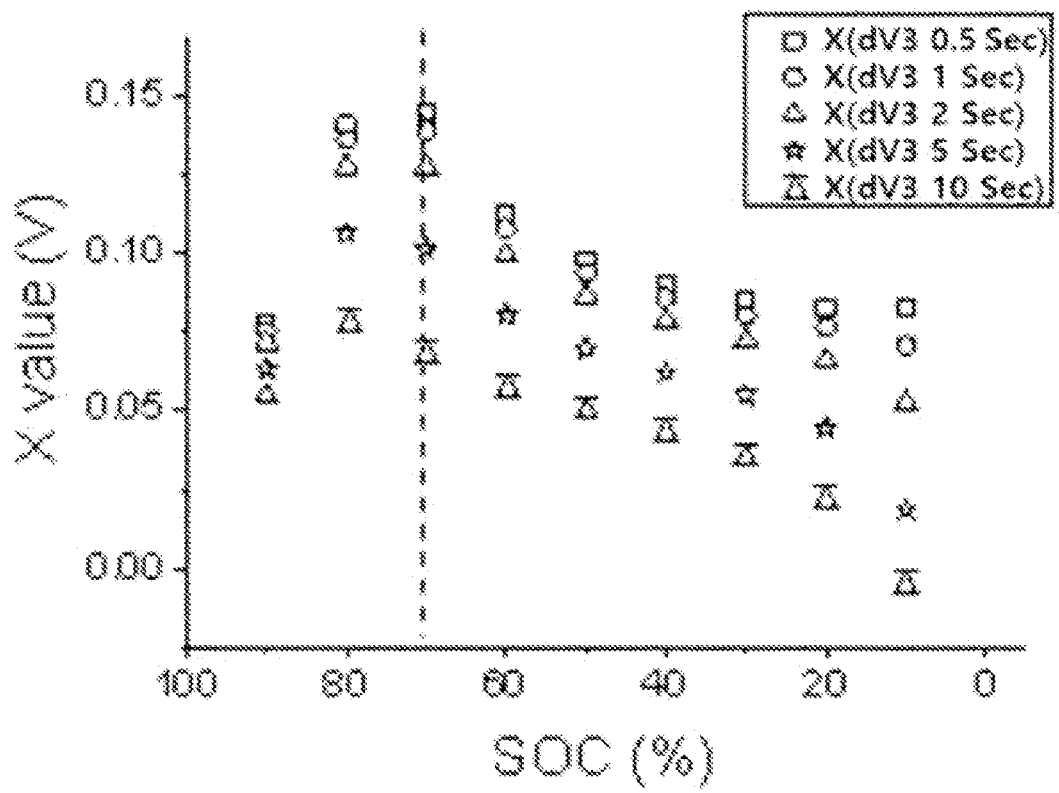
【Figure 6】
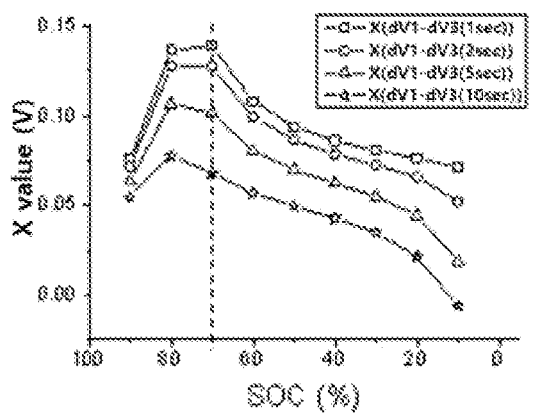
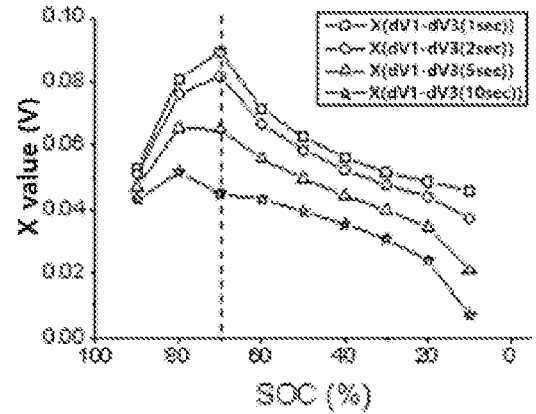

[Figure 7]
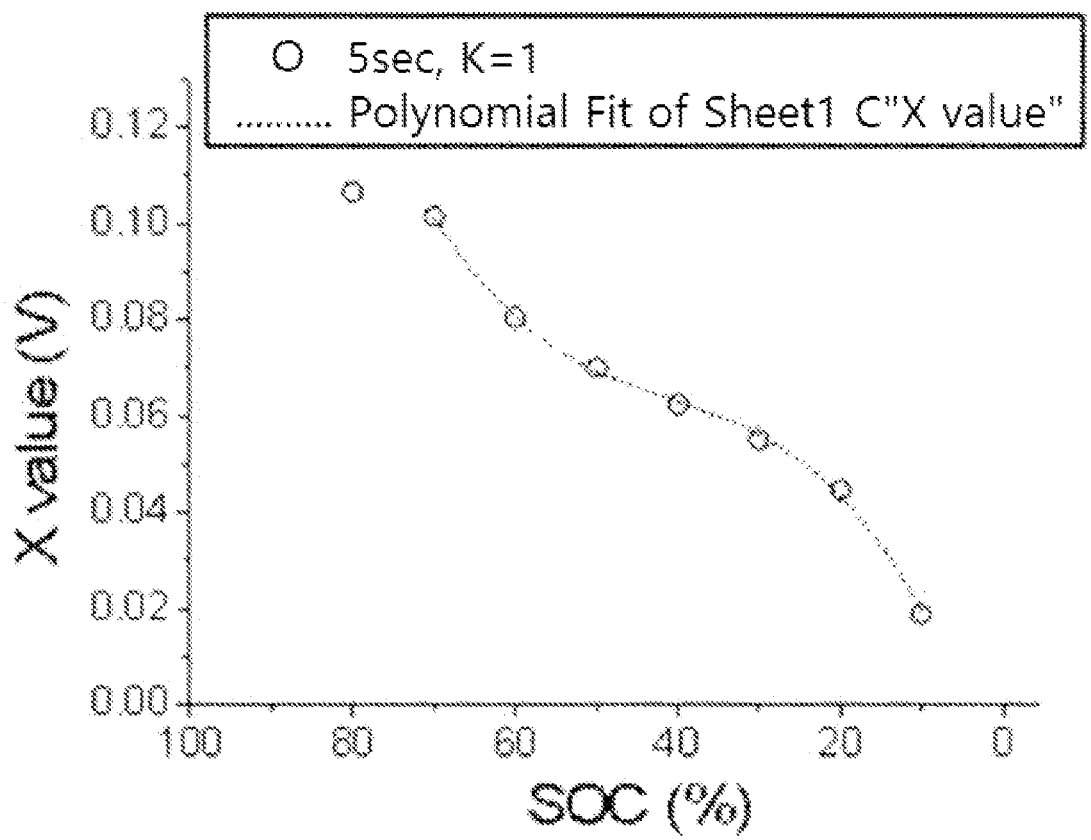

【Figure 8】
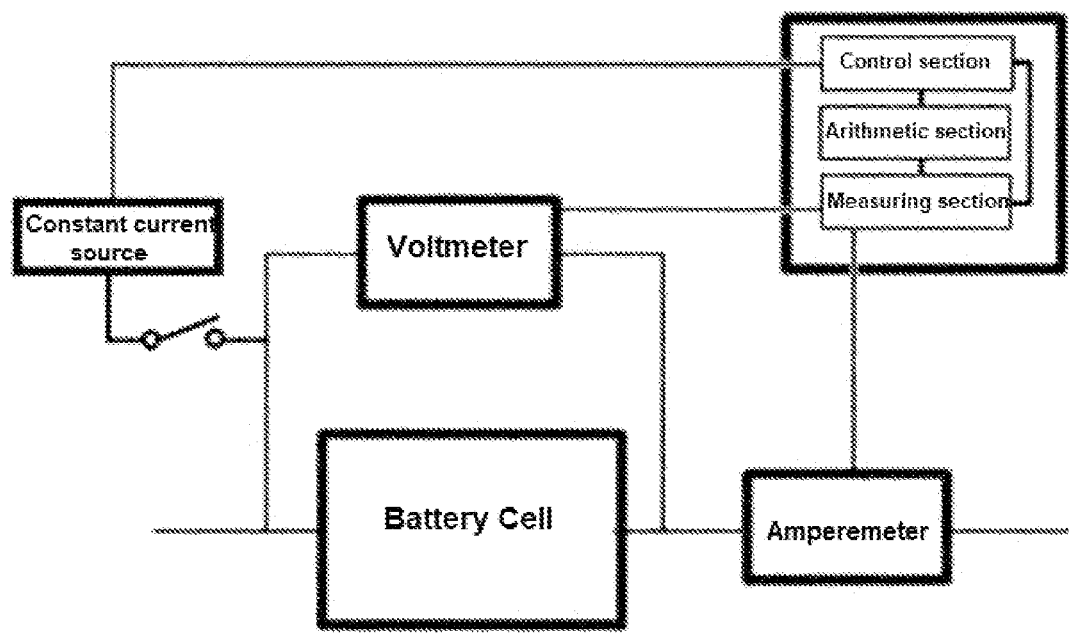

[Figure 9]
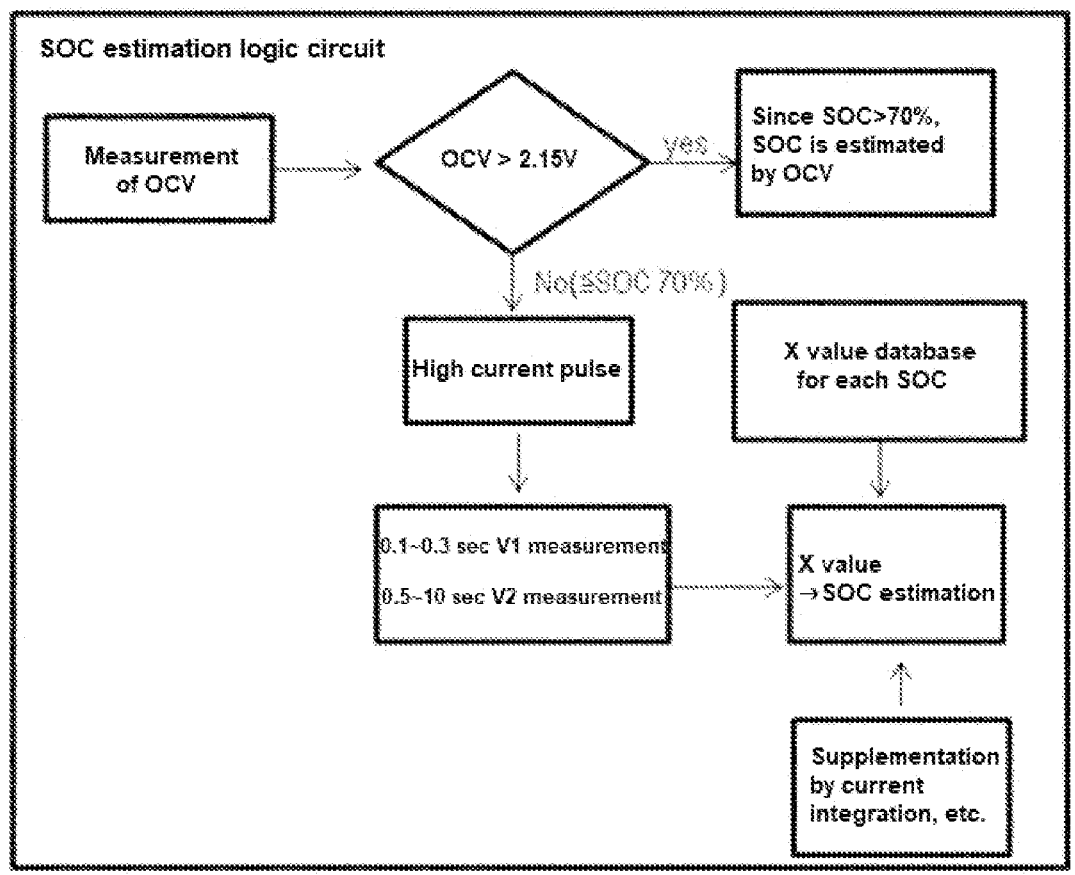

METHOD FOR DETERMINING REMAINING CAPACITY OF LITHIUM-SULFUR BATTERY, AND BATTERY PACK IMPLEMENTING SAME METHOD

CROSS-REFERENCE TO RELATED APPLICATION(S)

This is a National Phase entry pursuant to 35 U.S.C. 371 of International Application No. PCT/KR2021/014719 filed on Oct. 20, 2021, and claims priority to and the benefit of priority based on Korean Patent Application No. 10-2020-0136625 filed on Oct. 21, 2020, the entire contents of which are incorporated herein by reference.

TECHNICAL FIELD

The present disclosure relates to a method for determining the remaining capacity of a lithium-sulfur battery and to a battery pack for implementing the method.

BACKGROUND

Recently, as portable electronic devices, electric vehicles, and large-capacity power storage systems have developed, the need for large-capacity batteries is emerging. The lithium-sulfur battery is a secondary battery using a sulfur-based material having an S—S bond (sulfur-sulfur bond) as a positive electrode active material and using lithium metal as a negative electrode active material, and there is an advantage that sulfur, which is the main material of the positive electrode active material, is very rich in resources, is non-toxic, and has a low atomic weight.

The theoretical discharging capacity of the lithium-sulfur battery is 1672 mAh/g-sulfur and its theoretical energy density is 2,600 Wh/kg, and the theoretical energy density of the lithium-sulfur battery is much higher than the theoretical energy density of other battery systems currently under study and thus is attracting attention as a battery with high energy density characteristics.

A typical lithium-sulfur battery includes an anode (negative electrode) formed of lithium metal or lithium metal alloy and a cathode (positive electrode) formed of elemental sulfur or other electroactive sulfur material.

Sulfur at the cathode of a lithium-sulfur battery is reduced in two stages when discharging. In the first stage, sulfur (e.g., elemental sulfur) is reduced to lithium polysulfides ($Li_2S_8$, $Li_2S_6$, $Li_2S_5$, $Li_2S_4$). These species are largely soluble in an electrolyte solution. In the sec stage, the lithium polysulfides are reduced to $Li_2S$, which may be deposited on the surface of the anode. Conversely, during charging, $Li_2S$ is oxidized to lithium polysulfides ($Li_2S_8$, $Li_2S_6$, $Li_2S_5$, $Li_2S_4$), and then to lithium and sulfur.

The lithium polysulfide is present at a maximum when the remaining capacity (SOC) of the lithium-sulfur battery is 70%, and thereafter, it decreases. According to this mechanism, the electrochemical reaction of the lithium-sulfur battery is changed when the remaining capacity (SOC) is 70%, and as shown in FIG. 1, the OCV or operating voltage of the lithium-sulfur battery and the remaining capacity are not proportional to each other.

Therefore, unlike a typical lithium-ion battery that can determine the remaining capacity only by measuring the voltage as the voltage is continuously reduced according to the amount of discharging, the lithium-sulfur battery has a characteristic that cannot reliably determine the remaining capacity only by measuring the voltage when the remaining capacity is less than 70%.

As a conventional technique for solving these problems, there is known a method for inferring internal resistance by introducing complex modeling, a method for monitoring the change in electrolyte properties with an optical method or so on.

However, in the case of the conventional techniques as described above, it seems that the method for estimating remaining capacity is not only complicated, but also the precision of remaining capacity estimation is not sufficient.

SUMMARY

The present disclosure has been devised to solve the problems of the prior art as described above, and thus it is an object of the present disclosure to provide a method for determining the remaining capacity of a lithium-sulfur battery, which is capable of reliably determining the remaining capacity in the lithium-sulfur battery in a simple manner, and a battery pack for implementing the method.

In order to achieve the above object, the present disclosure provides a method for determining the remaining capacity of a lithium-sulfur battery comprising the steps of,
a) measuring the initial voltage drop value dV1 at any one point in the range of 0.01 to 0.3 sec after applying a constant current to the battery in an open-circuit state;
b) measuring the late voltage drop value dV2 at any one point in the range of 0.5 sec to 20 sec after the application of the constant current;
c) computing the additional voltage drop value dV3 by Equation 1 below;
d) computing the value of X by Equation 2 below; and
e) determining the remaining capacity (SOC, state of charge) of the battery from the X value:

$$dV3 = dV2 - dV1 \qquad \text{[Equation 1]}$$

$$X = dV1 - dV3. \qquad \text{[Equation 2]}$$

In addition, the present disclosure provides a battery pack having a lithium-sulfur battery, which comprises,
a constant current source for applying a constant current to the battery;
a measuring section (or measuring unit) for measuring the voltage and current of the battery;
a control section (or control unit) for controlling the constant current source and the measuring section (or measuring unit); and
an arithmetic section (or computing unit) for determining the remaining capacity of the battery by computing the voltage and current values measured in the measuring section (or measuring unit),
wherein when determining the remaining capacity of the battery,
the control section (or control unit) applies the constant current from a constant current source to the battery in an open-circuit state, and controls a measuring section (or measuring unit) to measure the voltage at any one point in the range of 0.01 to 0.3 sec after the application of the constant current and at any one point in the range of 0.5 sec to 20 sec after the application of the constant current, and
the arithmetic section (or computing unit) computes the voltage drop value dV1 at any one point in the range of 0.01 to 0.3 sec and the voltage drop value dV2 at any point in the range of 0.5 sec to 20 sec from the voltage measurement value, and then calculates dV3 and X values by Equation 1 below and Equation 2 below, and calculates the remaining capacity of the battery from the X value:

$$dV3 = dV2 - dV1 \quad \text{[Equation 1]}$$

$$X = dV1 - dV3. \quad \text{[Equation 2]}$$

The method for determining the remaining capacity of a lithium-sulfur battery of the present disclosure provides an effect of reliably determining the remaining capacity of a lithium-sulfur battery in a simple manner. In particular, even when the remaining capacity is 70% or less, the present disclosure provides the effect of determining the remaining capacity with high accuracy.

In addition, the battery pack of the present disclosure provides the effect of expanding the application target of the lithium-sulfur battery and improving the convenience of use by implementing the method as described above.

BRIEF DESCRIPTION OF THE DRAWINGS

FIG. 1 is a graph showing the relationship between the OCV or the operating voltage and the remaining capacity of a lithium-sulfur battery.

FIG. 2 is a graph showing the aspect of voltage drop with time that appears when applying a high output pulse (constant current) at the SOC of 70% or less of a lithium-sulfur battery.

FIG. 3 is a graph showing the relationship between values of the sum and difference of the initial voltage drop dV1 and the additional voltage drop dV3 and the SOC with time, when applying a high output pulse (constant current) to the lithium-sulfur battery.

FIG. 4 is a graph showing the voltage change of the cell in each SOC with time, when applying a high output pulse (constant current) to the lithium-sulfur battery.

FIG. 5 is a graph showing the relationship between the X value and the SOC according to the measurement time point of the additional voltage drop value dV3, which is obtained by applying a high output pulse (constant current) to the lithium-sulfur battery.

FIG. 6 is a graph showing the relationship between the X value and the SOC according to the measurement time point of the additional voltage drop value dV3, which is obtained from each high output pulse by applying the high output pulse to the lithium-sulfur battery.

FIG. 7 is a graph showing the relationship between the X value and the SOC, which is obtained by applying a high output pulse (constant current, 1.0C) at each remaining capacity (SOC) of a lithium-sulfur battery, and then measuring the initial voltage drop value dV1 at the time point of 0.1 sec and measuring the late voltage drop value dV2 at the time point of 5 sec to obtain the value of X, and separately showing and comparing the SOC fitting curve.

FIG. 8 schematically shows an example of the battery pack according to one embodiment of the present disclosure.

FIG. 9 schematically illustrates an example of an estimation logic circuit of the remaining capacity (SOC) according to one embodiment of the present disclosure.

DETAILED DESCRIPTION

Hereinafter, with reference to the accompanying drawings, preferred embodiments of the present disclosure will be described in detail. Prior to describing the present disclosure, if it is determined that a detailed description of related known functions and configurations may unnecessarily obscure the gist of the present disclosure, a description thereof will be omitted.

The description and drawings below illustrate specific embodiments to enable those skilled in the art to readily practice the described apparatus and method. Other embodiments may include other structural and logical modifications. Individual components and functions may generally be selected, unless expressly required, and the sequence of processes may vary. Portions and features of some embodiments may be included in or replaced by other embodiments.

Sulfur at the cathode of a lithium-sulfur battery is reduced in two stages when discharging. In the first stage, sulfur (e.g., elemental sulfur) is reduced to lithium polysulfides ($Li_2S_8$, $Li_2S_6$, $Li_2S_5$, $Li_2S_4$) In the sec stage, the lithium polysulfides are reduced to $Li_2S$, which may be deposited on the surface of the anode. Conversely, during charging, $Li_2S$ is oxidized to lithium polysulfides ($Li_2S_8$, $Li_2S_6$, $Li_2S_5$, $Li_2S_4$), and then to lithium and sulfur.

The lithium polysulfides are present at a maximum when the remaining capacity (SOC) of the lithium-sulfur battery is 70%, and thereafter, they are decreased. According to this mechanism, the electrochemical reaction of the lithium-sulfur battery is changed when the remaining capacity (SOC) is 70%, and as shown in FIG. 1, the lithium-sulfur battery exhibits a characteristic that the OCV or operating voltage of the lithium-sulfur battery and the remaining capacity are not proportional to each other.

In spite of these characteristics of the lithium-sulfur battery, the inventors of the present disclosure have found a method that can reliably determine the remaining capacity with a simple method, and thus completed the present disclosure.

The present disclosure provides a method for determining the remaining capacity of a lithium-sulfur battery comprising the steps of,
 a) measuring the initial voltage drop value dV1 at any one point in the range of 0.01 to 0.3 sec after applying a constant current to the battery in an open-circuit state;
 b) measuring the late voltage drop value dV2 at any one point in the range of 0.5 sec to 20 sec after the application of the constant current;
 c) computing the additional voltage drop value dV3 by Equation 1 below;
 d) computing the value of X by Equation 2 below; and
 e) determining the remaining capacity (SOC, state of charge) of the battery from the X value:

$$dV3 = dV2 - dV1 \quad \text{[Equation 1]}$$

$$X = dV1 - dV3. \quad \text{[Equation 2]}$$

The inventors of the present disclosure have noted that when a high output pulse is applied during discharging in a lithium-sulfur battery, a voltage drop is made from the OCV in a very short time (dV1), and then an additional voltage drop is made slowly (dV3), as shown in the graph on the right of FIG. 2. This phenomenon occurs because dV1 is greatly affected by the ion conductivity and electron transfer reaction of the electrolyte solution, and dV3 is greatly affected by mass transfer resistance due to the delay of material diffusion.

That is, due to the characteristics of the lithium-sulfur battery, the amount of the leaching polysulfides is the largest at 70% SOC, and at this point, the viscosity of the electrolyte solution is also the highest, and thus the ion conductivity shows the lowest value. On the other hand, since the resistance is large, the initial voltage drop (dV1) is the largest when a high output pulse is applied. After that, during discharging, polysulfides are reduced to $Li_2S$ form and solidified, and the amount of polysulfides is rather reduced, and the initial voltage drop (dV1) tends to be lowered.

On the other hand, as the SOC progresses below 70%, the amount of reactants in the reaction solution is gradually decreased, so that the mass transfer resistance is gradually increased due to the decrease in concentration, and thus the additional voltage drop (dV3), which is highly affected by the mass transfer resistance, becomes larger and larger.

FIG. 3 is a graph showing the relationship between values of the sum and difference of the initial voltage drop (dV1) and the additional voltage drop (dV3) and the SOC with time, when applying a high output pulse (constant current, 1.0C) to the lithium-sulfur battery. As can be seen in FIG. 3, in the case of the graph showing the value X obtained by subtracting the additional voltage drop value (dV3) from the initial voltage drop value (dV1), when the SOC is 70% or less, the X value tends to decrease continuously in accordance with the decreasing trend of the SOC.

Therefore, from these results, it is confirmed that the remaining capacity (SOC) of the lithium-sulfur battery may be determined from the X value.

In the method of determining the remaining capacity of the present disclosure, the initial voltage drop value (dV1) can be measured at any one point in the range of 0.01 to 0.3 sec, preferably in the range of 0.01 to 0.2 sec, more preferably in the range of 0.01 to 0.1 sec, after applying the constant current.

FIG. 4 shows the voltage change of the cell in each SOC with time, when applying a high output pulse (constant current) to the lithium-sulfur battery. As can be seen from FIG. 4, if the measurement time point of the initial voltage drop value (dV1) exceeds 0.3 sec, since an additional voltage drop appears according to the increase in mass transfer resistance, it is preferable to measure the initial voltage drop value (dV1) within 0.3 sec for the accuracy of the measurement of the remaining capacity.

In the method of determining the remaining capacity of the present disclosure, the additional voltage drop value (dV3) can be obtained by measuring the late voltage drop value (dV2) at any one point in the range of 0.5 to 20 sec after the constant current is applied, and computing by Equation 1 below:

$$dV3=dV2-dV1 \qquad \text{[Equation 1]}$$

In this case, the late voltage drop value dV2 is preferably measured in the range of 1 sec to 20 sec, and more preferably measured in the range of 2 sec to 10 sec.

FIG. 5 is a graph showing the relationship between the X value and the SOC according to the measurement time point of dV3, which is obtained by applying a high output pulse (constant current, 1.0C), and then measuring the initial voltage drop value (dV1) at 0.1 sec and measuring the late voltage drop value (dV2) in the range of 0.5 sec to 10 sec (in this case, the measurement point of dV3 is the same as that of dV2) to obtain an additional voltage drop value (dV3), and computing the X value according to Equation 2 below:

$$X=dV1-dV3 \qquad \text{[Equation 2]}$$

As can be seen from FIG. 5 above, it can be seen that when the late voltage drop value dV2 (or additional charge drop value dV3) was measured in the range of 1 sec to 10 sec, the X value is more corresponds to the decreasing trend in the SOC than when measured at 0.5 sec.

In particular, it can be seen that when the late voltage drop value (dV2) is measured in the range of 2 to 10 sec, the X value better corresponds to the decreasing trend of the SOC.

In the method of determining the remaining capacity of the present disclosure, it is preferable to apply a constant current of 0.5C or more. When the constant current is applied at less than 0.5C, since the voltage drop value is small, it is difficult to accurately and reliably determine the remaining capacity, and thus is not preferable.

In addition, it is preferable to apply the constant current at 2C or less, and more preferably, at 1C or less. When the constant current is applied in excess of 2C, while the improvement in additional accuracy is not large, it is not preferable because a large amount of power is consumed.

FIG. 6 is a graph showing the relationship between the X value according to the measurement time point of dV3 (the measurement point of dV2 is also the same), and the SOC, which is obtained by applying a high output pulse (constant current, 0.5C or 1.0C), and then measuring the initial voltage drop value (dV1) at 0.1 sec, and obtaining an additional voltage drop value (dV3) in the range of 1 sec to 10 sec.

As can be seen from FIG. 6, it can be seen that in both cases where constant current is applied at 0.5C or 1.0C, the values of X correspond well to the decreasing tendency of the SOC.

In the method of determining the remaining capacity of the present disclosure, the application of the constant current may be performed by a constant current generated during operation of the battery; or may be performed from a separate constant current source; or may be complexly performed by the constant current generated during operation of the battery and the separate constant current source.

For example, if a constant current occurs during operation of the battery, this constant current can be used, and in the section where constant current does not occur during operation of the battery, the constant current can be applied by allowing different battery modules to charge/discharge from each other or by installing a separate small capacitor for measuring the SOC and charging the capacitor.

In addition, only the constant current applied by a separate constant current source can be used, and when the constant current is sufficiently generated during battery operation, it is also possible to use only the constant current generated during operation without using a separate constant current source.

FIG. 7 shows the relationship between the X value and the SOC, which is obtained by applying a high output pulse (constant current, 1.0C) at each remaining capacity (SOC), and then measuring the initial voltage drop value (dV1) at 0.1 sec and measuring the late voltage drop value (dV2) at 5 sec, and obtaining the additional voltage drop value (dV3) and the X value, and shows the SOC fitting curve in comparison, which is obtained by using the normal polynomial function approximation for the cubic function closest to the relevant curve.

As can be seen from FIG. 7, it can be seen that the X values according to the SOC and the SOC fitting curve are almost identical. Therefore, it is possible to confirm the accuracy of the method for determining the remaining capacity of the present disclosure from this fact.

The method of determining the remaining capacity of the present disclosure may be preferably used due to the characteristics of the chemical reaction of the lithium-sulfur battery, when the remaining capacity of the battery is 70% or less.

In one embodiment of the present disclosure, when the remaining capacity exceeds 70%, it may be preferable to determine the remaining capacity of the battery by an open-circuit voltage (OCV) value of the battery. This is because, even in the case of a lithium-sulfur battery, in the range where the remaining capacity exceeds 70%, the change value of the open-circuit voltage (OCV) shows a trend that coincides with the decreasing trend of the SOC, as shown in FIG. 1.

In one embodiment of the present disclosure, in the case of the method of determining the remaining capacity of the present disclosure, if the remaining capacity of the battery exceeds 70%, the remaining capacity is determined by the OCV (open-circuit voltage) value of the battery, and if the remaining capacity is 70% or less, the measurement of the remaining capacity may be performed in a manner of determining by the X value of the present disclosure.

In addition, in one embodiment of the present disclosure, method of determining the remaining capacity of the present disclosure may be performed in a manner that the determination of the remaining capacity is supplemented by a voltage method for detecting the remaining capacity of the battery by measuring the voltage of the battery; an integration method to obtain the remaining capacity of the battery by measuring and integrating the voltage and current; or a method of using the voltage method and the integration method together.

For the voltage method for detecting the remaining capacity of the battery by measuring the voltage of the battery; the integration method to obtain the remaining capacity of the battery by measuring and integrating the voltage and current; or the method of using the voltage method and the integration method together, methods known in the art may be used without limitation.

For example, in the case of the detection method using the voltage method for detecting the remaining capacity of the battery by measuring the voltage of the battery, the terminal voltage of the battery cell is measured, the remaining capacity is calculated based on the correlation between the voltage of the battery and the capacity (remaining capacity rate) of the battery, and for example, in the lithium-sulfur battery, if the battery voltage is 2.4V/cell, it is determined that the battery is fully charged, and if the voltage of the battery becomes 1.8V/cell, it can be determined that the battery is in an overcharging state, and thereby, a measurement can be made easily. However, if the remaining capacity is detected using the voltage method during discharging, there is a problem that the detection accuracy of the remaining capacity is very poor in the range where the SOC of the battery is 70% or less, as described above. Therefore, this problem can be solved according to the method of determining the remaining capacity of the present disclosure.

The integration method to obtain the remaining capacity of the battery by measuring and integrating the voltage and current can be classified into a current integration method that measures the current and integrates the measured current at regular time intervals, and a power integration method that measures the voltage and current, calculates the amount of power by multiplying the measured voltage and the measured current, and also integrates the calculated amount of power at regular time intervals. In all of the above integration methods, after calculating the amount of discharging current or the amount of discharging power, the remaining capacity of the battery may be calculated from a ratio of the amount of the calculated discharging current or the calculated discharging power to the amount of usable current or power of the battery, and this enables stable detection of the remaining capacity without being influenced by voltage fluctuations.

However, in the case of detecting the remaining capacity using the integration method, there is a problem that the detection accuracy of the remaining capacity is deteriorated at the end of discharging. This is because errors in voltage and current measurements or errors in integrated current or power due to heat loss are also accumulated, and a large error occurs at the end of discharging, which leads to a decrease in accuracy.

Therefore, another method of detecting the charging capacity by using the integration method and the voltage method together is used. This detection method uses the integration method from the start of charging until close to full charging, and then switches the integration method to the voltage method in the vicinity of full charge to detect the charging capacity, and thereby, the above methods are capable of performing the measurements in the area where they are most effective.

However, in the case of the voltage method, when the current of the battery represents a small value, high precision is provided for the calculation of its capacity, whereas, when the current represents a large value, an accurate open circuit voltage cannot be obtained due to a direct current impedance (Imp) or a change in Imp in the battery depending on the ambient temperature, and thereby the capacity of the battery cannot be accurately calculated. Furthermore, in the case of the integration method, when the current of the battery represents a large value, high precision is provided for the calculation of capacity, whereas, when the current decreases, the integration error increases and thus the precision in calculating the capacity is deteriorated. Therefore, it is also possible to detect the capacity of the battery by using other methods together with the voltage method and the integration method.

In addition, in one embodiment of the present disclosure, the method of determining the remaining capacity of the present disclosure may be performed in a manner of determining the remaining capacity of the battery by obtaining each X value according to the remaining capacity in advance, determining the remaining capacity value according to the X value and using them as a reference.

In this case, the remaining capacity value according to the X value may be determined and used using the various methods described above, or a more precise remaining capacity value may be determined and used by using these methods in combination.

In addition, the present disclosure relates to a battery pack having a lithium-sulfur battery, which comprises,
    a constant current source for applying a constant current to the battery;
    a measuring section (or measuring unit) for measuring the voltage and current of the battery;
    a control section (or control unit) for controlling the constant current source and the measuring section (or measuring unit); and
    an arithmetic section (or computing unit) for determining the remaining capacity of the battery by computing the voltage and current values measured in the measuring section (or measuring unit),
    wherein when determining the remaining capacity of the battery,
    the control section (or control unit) applies the constant current from a constant current source to the battery in an open-circuit state, and controls a measuring section (or measuring unit) to measure the voltage at any one point in the range of 0.01 to 0.3 sec after the application of the constant current and at any one point in the range of 0.5 sec to 20 sec after the application of the constant current, and the arithmetic section (or computing unit) computes the voltage drop value dV1 at any one point in the range of 0.01 to 0.3 sec and the voltage drop value dV2 at any point in the range of 0.5 sec to 20 sec from the voltage measurement value, and then calculates dV3 and X values by Equation 1 below and Equation 2 below, and calculates the remaining capacity of the battery from the X value:

$$dV3=dV2-dV1 \qquad \text{[Equation 1]}$$

$$X=dV1-dV3 \qquad \text{[Equation 2]}$$

The battery pack may have, for example, the shape shown in FIG. 8. At this time, one or two or more batteries may be included, and for the constant current source, the control section (or control unit), the arithmetic section (or computing unit), the measuring section (or measuring unit), etc., a device known in the art may be used without limitation As for the method of determining the remaining capacity in the battery pack, the method described above may be applied as it is.

In one embodiment of the present disclosure, if the constant current generated during operation of the battery is available, the control section (or control unit) may be operated to control the constant current source not to be operated, and to determine the remaining capacity using the constant current generated during the operation.

In one embodiment of the present disclosure, the battery pack can be operated in such a way that when the remaining capacity of the battery exceeds 70%, the control section (or control unit) prevents the constant current source from operating and controls a measuring section (or measuring unit) to measure the open-circuit voltage (OCV) value of the battery, and that when the remaining capacity of the battery exceeds 70%, the arithmetic section (or computing unit) calculates the remaining capacity of the battery from the measured open-circuit voltage (OCV) value.

In one embodiment of the present disclosure, in the battery pack, the determination of the remaining capacity may be supplemented by further performing a voltage method for detecting the remaining capacity of the battery by measuring the voltage of the battery; an integration method to obtain the remaining capacity of the battery by measuring and integrating the voltage and current; or a method of using the voltage method and the integration method together.

In one embodiment of the present disclosure, the arithmetic section (or computing unit) of the battery pack may be operated in such a way that the remaining capacity of the battery is determined by obtaining the X value according to the value of the remaining capacity of the battery and the data of the remaining capacity according to the X value in advance and storing them as a reference, and comparing the X value obtained by the computing with the reference.

FIG. 9 schematically illustrates an example of an estimation logic circuit of the remaining capacity (SOC) according to one embodiment of the present disclosure. An operation mode of the remaining capacity (SOC) estimation logic circuit will be described as an example with reference to FIG. 9 as follows.

First, the OCV of the battery is measured. If the OCV value exceeds 2.15V, since the SOC exceeds 70%, the SOC is estimated using the OCV (depending on the design of the battery, the reference OCV may be slightly different from 2.15V, and the OCV that remains the same at SOC 70% or less becomes the reference value rather than the OCV being fixed at 2.15V).

In this case, it is of course possible to estimate the SOC by the various methods described above.

On the other hand, when the OCV value is 2.15V or less, since the SOC is 70% or less, a high current pulse (constant current) is applied to measure the initial voltage drop dV1 and the late voltage drop dV2, and to obtain the dV3 and X values, thereby estimating the SOC value.

In this case, the estimation of the SOC value is performed in a manner of calculating the SOC value by obtaining and storing in advance in the database and comparing the X value for each SOC with the X value obtained above.

In this case, the SOC value calculated above may be supplemented by a voltage method for detecting the remaining capacity of the battery by measuring the voltage of the battery as described above; an integration method to obtain the remaining capacity of the battery by measuring and integrating the voltage and current; or a method of using the voltage method and the integration method together, etc.

The 2.15V used as the OCV value above is a typical OCV value of a lithium-sulfur battery, which may be changed depending on individual characteristics of various types of lithium-sulfur batteries.

Although the present disclosure has been described in connection with the above-mentioned preferred embodiments, various modifications and variations can be made without departing from the spirit and scope of the disclosure. Accordingly, the appended claims will cover such modifications and variations as long as they fall within the scope of the present disclosure.

The invention claimed is:

1. A method for determining a remaining capacity of a lithium-sulfur battery, the method comprising the steps of:
    a) measuring an initial voltage drop value dV1 in an open-circuit state at any one point within 0.01 second to 0.3 second after applying a constant current to the lithium-sulfur battery;
    b) measuring a late voltage drop value dV2 in the open-circuit state at any one point within 0.5 second to 20 seconds after applying the constant current to the lithium-sulfur battery,
    c) computing an additional voltage drop value dV3 according to Equation 1:

$$dV3=dV2-dV1; \qquad \text{[Equation 1]}$$

d) computing a value of X according to Equation 2:

$$X=dV1-dV3; \text{ and} \qquad \text{[Equation 2]}$$

e) determining the remaining capacity of the lithium-sulfur battery from the value of X.

2. The method for determining the remaining capacity of the lithium-sulfur battery according to claim 1, wherein the constant current is applied at 0.5C to 2.0C.

3. The method for determining the remaining capacity of the lithium-sulfur battery according to claim 1,
    wherein the constant current is generated during operation of the lithium-sulfur battery;
    wherein the constant current is generated from a separate constant current source; or
    wherein the constant current is generated during operation of the lithium-sulfur battery and from the separate constant current source.

4. The method for determining the remaining capacity of the lithium-sulfur battery according to claim 1, wherein the method is applied when the remaining capacity of the lithium-sulfur battery is 70% or less.

5. The method for determining the remaining capacity of the lithium-sulfur battery according to claim 3, wherein when the remaining capacity of the lithium-sulfur battery exceeds 70%, the remaining capacity of the lithium-sulfur battery is determined based on an open-circuit voltage value of the lithium-sulfur battery.

6. The method for determining the remaining capacity of the lithium-sulfur battery according to claim 1, wherein the method determines the remaining capacity while supplementing the determination of the remaining capacity by:
   a voltage method for detecting the remaining capacity of the battery by measuring the voltage of the battery;
   an integration method to obtain the remaining capacity of the battery by measuring and integrating the voltage and current; or
   a method of using the voltage method and the integration method together.

7. The method for determining the remaining capacity of the lithium-sulfur battery according to claim 1, wherein the remaining capacity of the battery is determined by comparing the value of X to a reference value corresponding to a remaining capacity value.

8. A battery pack having a lithium-sulfur battery, comprising:
   a constant current source applying a constant current to the lithium-sulfur battery;
   a measuring unit measuring a voltage and a current of the lithium-sulfur battery;
   a control unit controlling the constant current source and the measuring unit; and
   a computing unit determining a remaining capacity of the lithium-sulfur battery by computing the voltage and the current measured by the measuring unit,
   wherein the control unit is configured to apply the constant current from the constant current source to the lithium sulfur battery in an open-circuit state when determining the remaining capacity of the lithium-sulfur battery,
   wherein the control unit is configured to controls the measuring section to measure the voltage at any one point within 0.01 second to 0.3 second after the application of the constant current and at any one point within 0.5 second to 20 seconds after the application of the constant current,
   wherein the computing unit is configured to computes a voltage drop value dV1 at any one point within 0.01 second to 0.3 second and a voltage drop value dV2 at any point within 0.5 second to 20 seconds from the voltage measurement point,
   wherein the computing unit is configure to calculates dV3 and a value of X based on Equation 1 and Equation 2;

$$dV3=dV2-dV1; \text{ and} \qquad \text{[Equation 1]}$$

$$X=dV1-dV3, \text{ and} \qquad \text{[Equation 2]}$$

wherein the computing unit is configured to calculate the remaining capacity of the lithium-sulfur battery from the value of X.

9. The battery pack according to claim 8, wherein the control unit is configured to control the constant current source to stop operating when the constant current generated during operation of the lithium-sulfur battery is available.

10. The battery pack according to claim 8, wherein the control unit is configured to stop the constant current source from operating when the remaining capacity of the battery exceeds 70%,
   wherein the control unit is configured to control the measuring unit to measure an open-circuit voltage value of the lithium-sulfur battery, and
   wherein computing unit is configured to calculates the remaining capacity of the battery from the measured open-circuit voltage value when the remaining capacity of the battery exceeds 70%.

11. The battery pack according to claim 8, wherein the battery pack supplements the determination of the remaining capacity by further performing:
   a voltage method for detecting the remaining capacity of the battery by measuring the voltage of the battery;
   an integration method to obtain the remaining capacity of the battery by measuring and integrating the voltage and current; or
   a method of using the voltage method and the integration method together.

12. The battery pack according to claim 8, wherein the computing unit determines the remaining capacity of the lithium-sulfur battery by comparing the value of X to a reference value corresponding to a remaining capacity value.

* * * * *